US012618149B2

(12) United States Patent
Nishida et al.

(10) Patent No.: US 12,618,149 B2
(45) Date of Patent: *May 5, 2026

(54) CLEANING METHOD, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Keigo Nishida, Toyama (JP); Kenichi Ishiguro, Toyama (JP); Takashi Ozaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 311 days.

This patent is subject to a terminal disclaimer.

(21) Appl. No.: 18/483,361

(22) Filed: Oct. 9, 2023

(65) Prior Publication Data

US 2024/0035155 A1     Feb. 1, 2024

Related U.S. Application Data

(63) Continuation of application No. 17/461,386, filed on Aug. 30, 2021, now Pat. No. 11,827,979.

(30) Foreign Application Priority Data

Aug. 31, 2020     (JP) ................................. 2020-145841

(51) Int. Cl.
*C23C 16/44*          (2006.01)
(52) U.S. Cl.
CPC ...... *C23C 16/4405* (2013.01); *C23C 16/4408* (2013.01)

(58) Field of Classification Search
None
See application file for complete search history.

(56) References Cited

U.S. PATENT DOCUMENTS 11,827,979 B2 * 11/2023 Nishida ................. C23C 16/401
2006/0213539 A1     9/2006 Hasebe et al.
(Continued)

FOREIGN PATENT DOCUMENTS

JP          2004-311929 A      11/2004
JP          2004-343095 A      12/2004
(Continued)

OTHER PUBLICATIONS

Korean Office Action issued on Oct. 11, 2023 for Korean Patent Application No. 10-2021-0114658, 13 Pages.
(Continued)

*Primary Examiner* — Kaj K Olsen
*Assistant Examiner* — Arlyn I Rivera-Cordero
(74) *Attorney, Agent, or Firm* — Volpe Koenig

(57)          ABSTRACT

There is provided a technique that includes removing a substance adhering to the interior of the process container by performing a cycle a predetermined number of times under a first temperature, the cycle including: (a) supplying one gas of a nitrogen- and hydrogen-containing gas and a fluorine-containing gas into the process container after a substrate is processed; and (b) supplying the other gas different from the one gas of the nitrogen- and hydrogen-containing gas and the fluorine-containing gas into the process container where the one gas remains.

22 Claims, 5 Drawing Sheets

(56) References Cited

U.S. PATENT DOCUMENTS

| | | | |
|---|---|---|---|
| 2014/0373867 | A1 | 12/2014 | Harada |
| 2015/0099373 | A1 | 4/2015 | Sano et al. |
| 2016/0236244 | A1 | 8/2016 | Takahashi et al. |

FOREIGN PATENT DOCUMENTS

| | | | |
|---|---|---|---|
| JP | 2011-134781 | A | 7/2011 |
| JP | 2016154209 | A | 8/2016 |
| KR | 10-2014-0135762 | A | 11/2014 |
| WO | 2009119177 | A1 | 10/2009 |
| WO | 2013/141370 | A1 | 9/2013 |

OTHER PUBLICATIONS

Japanese Office Action, Japanese Patent Application No. 2020-145841, May 31, 2022, 7 pgs.
Singapore Search Report, Singapore Patent Application No. 10202109504R, Sep. 26, 2022, 2 pgs.
Singapore Written Opinion, Singapore Patent Application No. 10202109504R, Sep. 26, 2022, 6 pgs.
Chinese Office Action issued on Oct. 17, 2024 for Chinese Patent Application No. 202110650848.9, 46 Pages.

\* cited by examiner

FIG. 1

CLEANING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a continuation of U.S. patent application Ser. No. 17/461,386, filed Aug. 30, 2021, now issued as U.S. Pat. No. 11,827,979 on Nov. 28, 2023, which is based upon and claims the benefit of priority from Japanese Patent Application No. 2020-145841, filed on Aug. 31, 2020, the entire contents of which are incorporated herein by reference.

TECHNICAL FIELD

The present disclosure relates to a cleaning method, a method of manufacturing a semiconductor device, a substrate processing apparatus, and a recording medium.

BACKGROUND

In the related art, as a process of manufacturing a semiconductor device, a process of cleaning an interior of a process container after a substrate is processed may be carried out.

SUMMARY

Some embodiments of the present disclosure provide a technique capable of enhancing an effect of cleaning an interior of a process container.

According to embodiments of the present disclosure, there is provided a technique that includes removing a substance adhering to an interior of the process container by performing a cycle a predetermined number of times under a first temperature, the cycle including: (a) supplying one gas of a nitrogen- and hydrogen-containing gas and a fluorine-containing gas into the process container after a substrate is processed; and (b) supplying the other gas different from the one gas of the nitrogen- and hydrogen-containing gas and the fluorine-containing gas into the process container where the one gas remains.

BRIEF DESCRIPTION OF DRAWINGS

The accompanying drawings, which are incorporated in and constitute a part of the specification, illustrate some embodiments of the present disclosure.

FIG. 1 is a schematic configuration view of a vertical process furnace of a substrate processing apparatus suitably used in embodiments of the present disclosure, in which a portion of the process furnace 202 is shown in a vertical cross section.

DETAILED DESCRIPTION

Embodiments of the Present Disclosure

Figure 2:
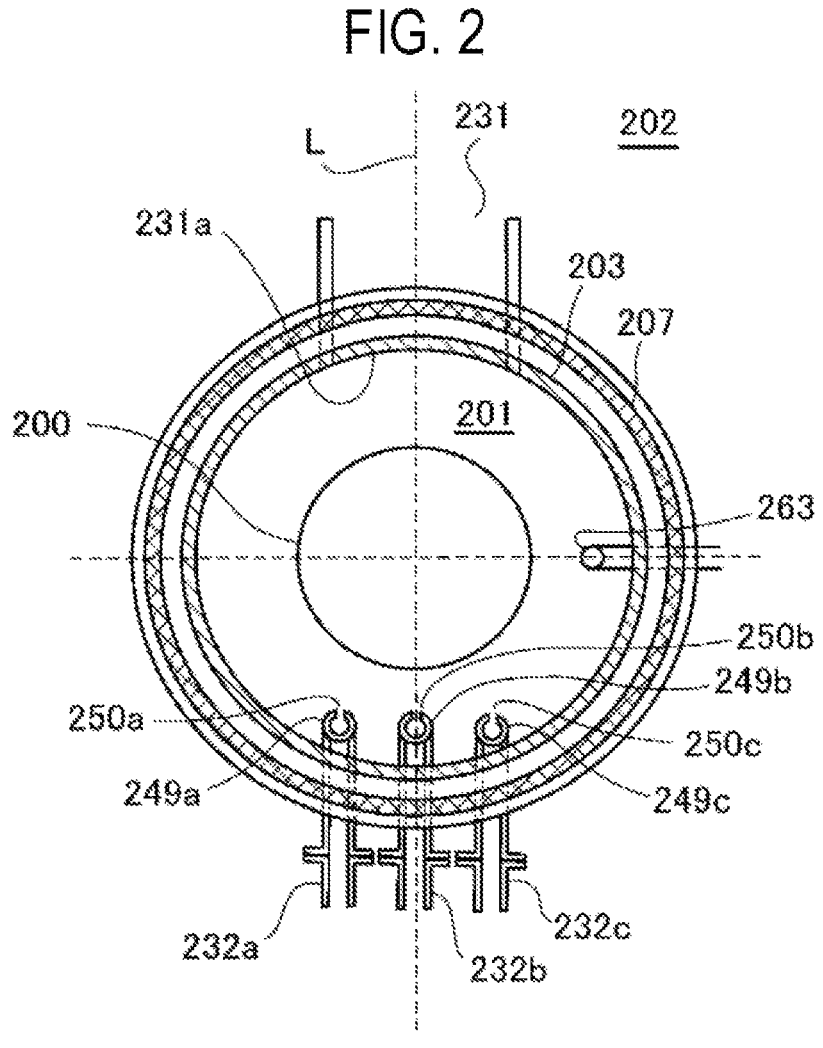
FIG. 2 is a schematic configuration view of a vertical process furnace of a substrate processing apparatus suitably used in embodiments of the present disclosure, in which a portion of a process furnace 202 is shown in a cross section taken along a line A-A in FIG. 1.

Embodiments of the present disclosure will be now described mainly with reference to FIGS. 1 to 5. The drawings used in the following description are all schematic, and dimensional relationships, ratios, and the like of various elements on a figure may not match actual ones. Further, dimensional relationships, ratios, and the like of various elements among plural figures may not be matched.

(1) Configuration of Substrate Processing Apparatus

Figure 1:
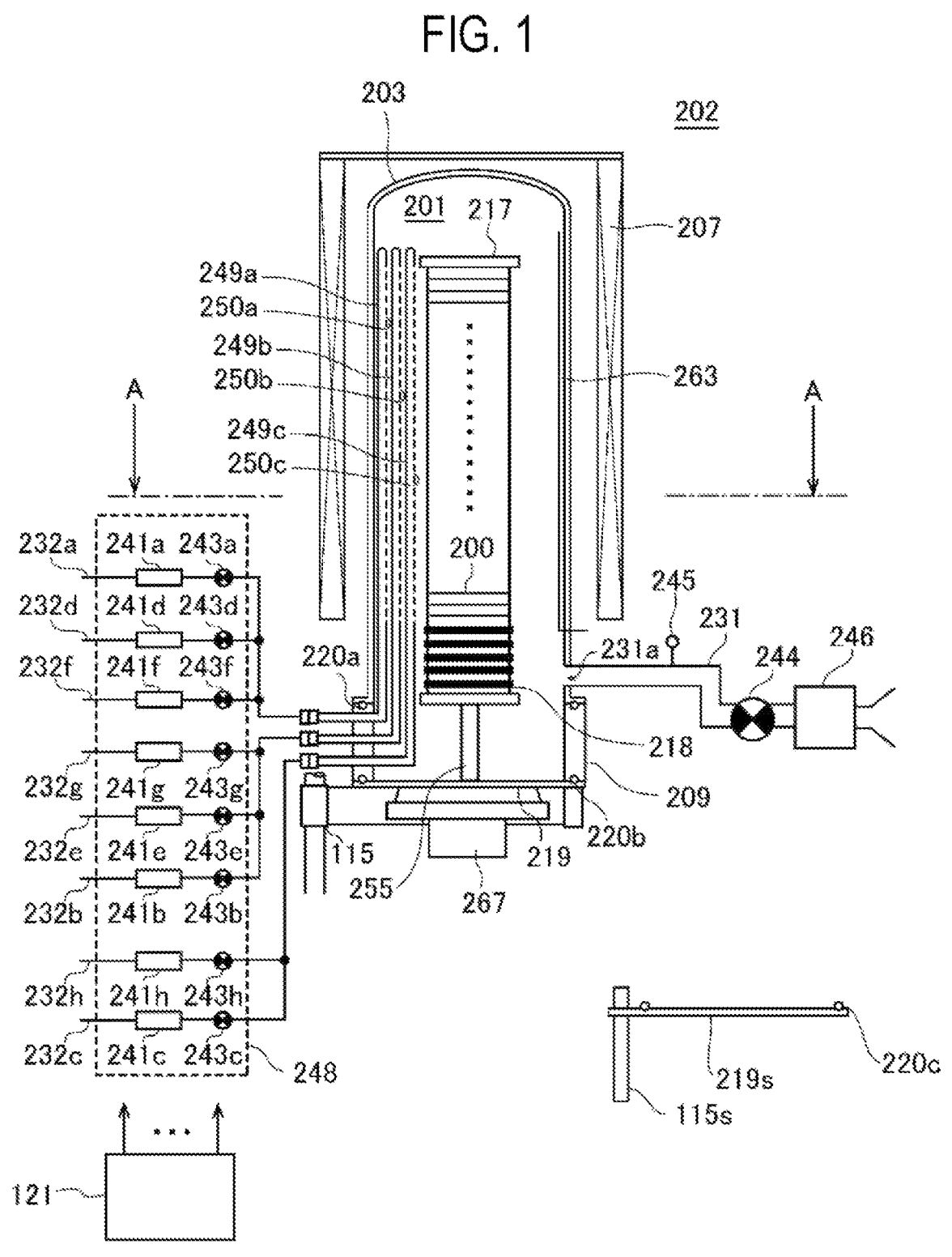

As shown in FIG. 1, a process furnace 202 includes a heater 207 as a temperature regulator (a heating part). The heater 207 has a cylindrical shape and is supported by a holding plate to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed below the reaction tube 203 in a concentric relationship with the reaction tube 203. The manifold 209 is made of, for example, a metal material such as stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating wafers 200 as substrates. The wafers 200 are processed in the process chamber 201.

Nozzles 249a to 249c as first to third supply parts are installed in the process chamber 201 to penetrate a sidewall of the manifold 209. The nozzles 249a to 249c will be also referred to as first to third nozzles, respectively. The nozzles 249a to 249c are each made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in this order at the gas supply pipes 232a to 232c from corresponding upstream sides of gas flow respectively. Gas supply pipes 232d and 232f are respectively connected to the gas supply pipe 232a at the downstream side of the valve 243a. Gas supply pipes 232e and 232g are respectively connected to the gas supply pipe 232b at the downstream side of the valve 243b. A gas supply pipe 232h is connected to the gas supply pipe 232c at the downstream side of the valve 243*c*. MFCs 241*d* to 241*h* and valves 243*d* to 243*h* are installed in this order at the gas supply pipes 232*d* to 232*h* from corresponding upstream sides of gas flow respectively. The gas supply pipes 232*a* to 232*h* are each made of, for example, a metal material such as SUS.

As shown in FIG. 2, the nozzles 249*a* to 249*c* are respectively installed in a space with an annular shape, when seen in a plane view, between an inner wall of the reaction tube 203 and the wafers 200 such that the nozzles 249*a* to 249*c* extend upward along an arrangement direction of the wafers 200 from a lower portion to an upper portion of the inner wall of the reaction tube 203. Specifically, the nozzles 249*a* to 249*c* are respectively installed at lateral side of a wafer arrangement region in which the wafers 200 are arranged, that is, in a region which horizontally surrounds the wafer arrangement region, so as to extend along the wafer arrangement region. The nozzle 249*b* is disposed to face an exhaust port 231*a*, which will be described below, on a straight line in the plane view, with centers of the wafers 200 that are loaded into the process chamber 201 interposed between the nozzle 249*b* and the exhaust port 231*a*. The nozzles 249*a* and 249*c* are disposed to sandwich a straight line L passing through the nozzle 249*b* and a center of the exhaust port 231*a* from both sides along the inner wall of the reaction tube 203 (an outer peripheral portion of the wafers 200). The straight line L is also a straight line passing through the nozzle 249*b* and the centers of the wafers 200. That is, the nozzle 249*c* may be installed at the opposite side of the nozzle 249*a* with the straight line L interposed therebetween. The nozzles 249*a* and 249*c* are disposed in line symmetry with the straight line L as the axis of symmetry. Gas supply holes 250*a* to 250*c* configured to supply a gas are respectively installed at the side surfaces of the nozzles 249*a* to 249*c*, respectively. The gas supply holes 250*a* to 250*c* are respectively opened to face the exhaust port 231*a* in the plane view, which enables a gas to be supplied toward the wafers 200. The gas supply holes 250*a* to 250*c* may be formed in a plural number between the lower portion to the upper portion of the reaction tube 203.

A processing gas, for example, a precursor (precursor gas), specifically a silane-based gas containing silicon (Si) as a main element forming a film to be formed on the wafer 200, is supplied from the gas supply pipe 232*a* into the process chamber 201 via the MFC 241*a*, the valve 243*a*, and the nozzle 249*a*. An example of the silane-based gas may include a gas containing Si and halogen, that is, a halosilane-based gas. The halogen includes chlorine (Cl), fluorine (F), bromine (Br), iodine (I), and the like. An example of the halosilane-based gas may include a chlorosilane-based gas containing Si and Cl.

A cleaning gas, for example, a nitrogen (N)- and hydrogen (H)-containing gas, is supplied from the gas supply pipe 232*b* into the process chamber 201 via the MFC 241*b*, the valve 243*b*, and the nozzle 249*b*. The N- and H-containing gas does not have a practical cleaning action by itself, but in the embodiments, the N- and H-containing gas is mixed with a F-containing gas to be described below under specific conditions to improve an efficiency of a cleaning process. Therefore, the N- and H-containing gas may be considered to be included in the cleaning gas in the same manner as the F-containing gas.

A processing gas, for example, an oxygen (O)-containing gas, which is an oxidizing gas (oxidizing agent), is supplied from the gas supply pipe 232*c* into the process chamber 201 via the MFC 241*c*, the valve 243*c*, and the nozzle 249*c*.

A cleaning gas, for example, a F-containing gas, is supplied from the gas supply pipe 232*d* into the process chamber 201 via the MFC 241*d*, the valve 243*d*, the gas supply pipe 232*a*, and the nozzle 249*a*.

A processing gas, for example, a H-containing gas, which is a reducing gas (reducing agent), is supplied from the gas supply pipe 232*e* into the process chamber 201 via the MFC 241*e*, the valve 243*e*, the gas supply pipe 232*b*, and the nozzle 249*b*. The H-containing gas does not have an oxidizing action by itself, but it reacts with an O-containing gas under specific conditions to generate oxidizing species such as atomic oxygen (O) to improve an efficiency of an oxidizing process. Therefore, the H-containing gas may be considered to be included in the oxidizing gas in the same manner as the O-containing gas.

An inert gas is supplied from the gas supply pipes 232*f* to 232*h* into the process chamber 201 via the MFCs 241*f* to 241*h*, the valves 243*f* to 243*h*, the gas supply pipes 232*a* to 232*c*, and the nozzles 249*a* to 249*c*, respectively. The inert gas acts as a purge gas, a carrier gas, a dilution gas, or the like.

A silane-based gas supply system mainly includes the gas supply pipe 232*a*, the MFC 241*a*, and the valve 243*a*. A N- and H-containing gas supply system mainly includes the gas supply pipe 232*b*, the MFC 241*b*, and the valve 243*b*. An O-containing gas supply system mainly includes the gas supply pipe 232*c*, the MFC 241*c*, and the valve 243*c*. A F-containing gas supply system mainly includes the gas supply pipe 232*d*, the MFC 241*d*, and the valve 243*d*. A H-containing gas supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*.

Each or all of the silane-based gas, the O-containing gas, and the H-containing gas are also referred to as a film-forming gas (processing gas), and each or all of the silane-based gas supply system, the O-containing gas supply system, and the H-containing gas supply system are also referred to as a film-forming gas supply system (processing gas supply system). Further, the silane-based gas supply system is also referred to as a precursor gas supply system, and the O-containing gas supply system and the H-containing gas supply system are also referred to as an oxidizing gas supply system (oxidizing agent supply system). Further, each or both of the N- and H-containing gas supply system and the F-containing gas supply system are also referred to as a cleaning gas supply system.

One or all of the above-described various gas supply systems may be configured as an integrated gas supply system 248 in which the valves 243*a* to 243*h*, the MFCs 241*a* to 241*h*, and the like are integrated. The integrated gas supply system 248 is configured to be connected to each of the gas supply pipes 232*a* to 232*h* such that supply operations of various gases into the gas supply pipes 232*a* to 232*h*, that is, an opening/closing operation of the valves 243*a* to 243*h*, a flow rate regulating operation by the MFCs 241*a* to 241*h*, and the like, are controlled by a controller 121 to be described below. The integrated gas supply system 248 is configured as an integral type or division type integrated unit, and is also configured such that it is detachable from the gas supply pipes 232*a* to 232*h* or the like so as to perform a maintenance, a replacement, expansion, and the like of the integrated gas supply system 248, on an integrated unit basis.

The exhaust port 231*a* configured to exhaust an internal atmosphere of the process chamber 201 is installed at a lower side of the sidewall of the reaction tube 203. As shown in FIG. 2, the exhaust port 231*a* is installed at a position opposing (facing) the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum exhaust device, for example, a vacuum pump 246, is connected to the exhaust pipe 231 via a pressure sensor 245, which is a pressure detector (pressure detection part) which detects the internal pressure of the process chamber 201, and an auto pressure controller (APC) valve 244, which is a pressure regulator (pressure regulation part). The APC valve 244 is configured such that a vacuum exhaust and a vacuum exhaust stop of the interior of the process chamber 201 may be performed by opening/closing the valve while the vacuum pump 246 is operated and such that the internal pressure of the process chamber 201 may be regulated by adjusting an opening degree of the valve based on pressure information detected by the pressure sensor 245 while the vacuum pump 246 is operated. An exhaust system mainly includes the exhaust pipe 231, the APC valve 244, and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of, for example, a metal material such as SUS, and is formed in a disc shape. An O-ring 220b, which is a seal member making contact with the lower end of the manifold 209, is installed at an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transfer device (transfer mechanism) which loads or unloads (transfers) the wafers 200 into and from (out of) the process chamber 201 by moving the seal cap 219 up or down.

A shutter 219s, which serves as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of, for example, a metal material such as SUS, and is formed in a disc shape. An O-ring 220c, which is a seal member making contact with the lower end of the manifold 209, is installed at an upper surface of the shutter 219s. An opening/closing operation (elevation operation, rotation operation, and the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that the interior of the process chamber 201 has a desired temperature distribution. The temperature sensor 263 is installed along the inner wall of the reaction tube 203.

Figure 3:
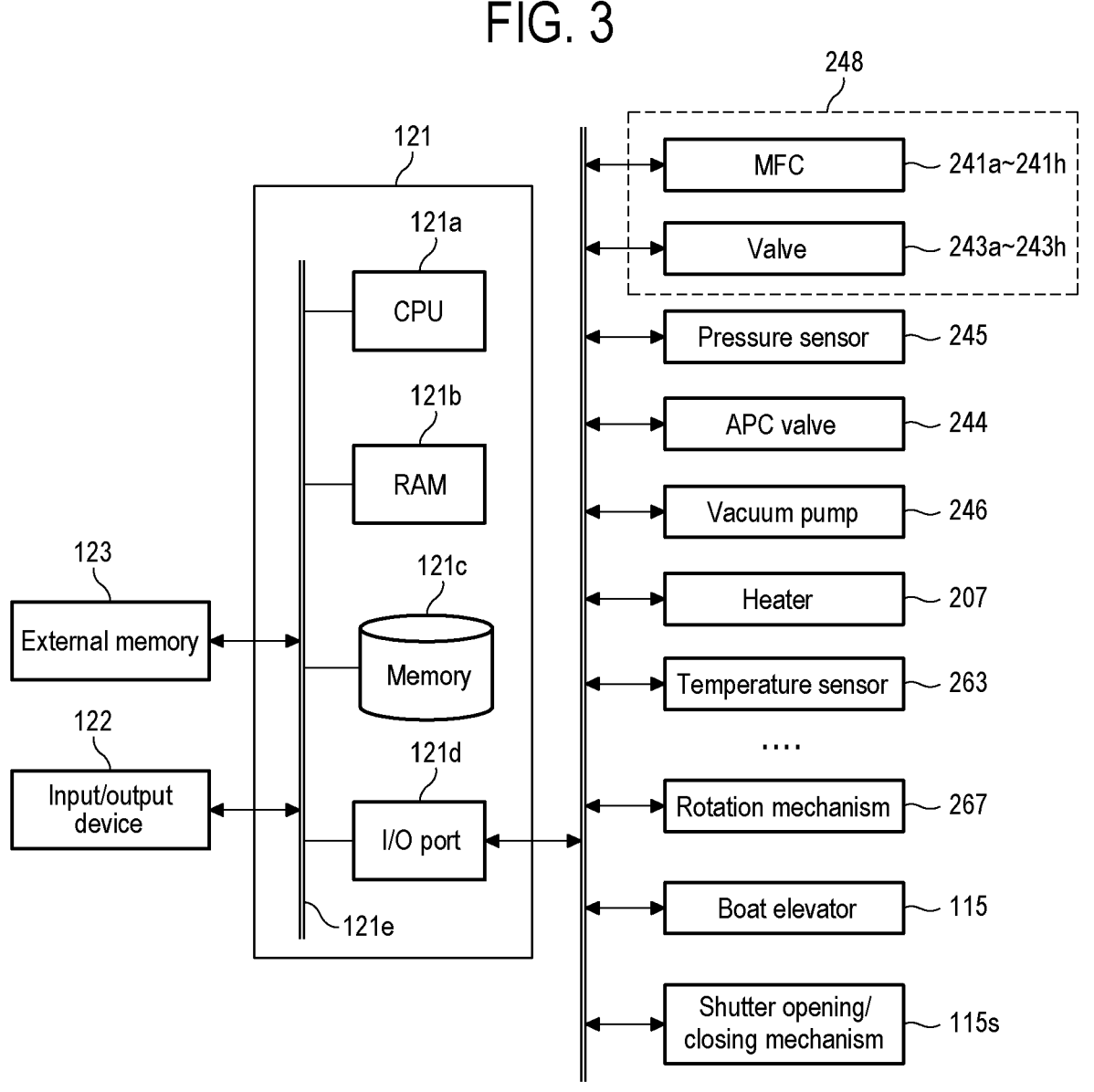
FIG. 3 is a schematic configuration diagram of a controller 121 of a substrate processing apparatus suitably used in embodiments of the present disclosure, in which a control system of a controller 121 is shown in a block diagram.

As shown in FIG. 3, a controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 configured as, for example, a touch panel or the like, is connected to the controller 121.

The memory 121c includes, for example, a flash memory, a hard disk drive (HDD), and the like. A control program that controls operations of a substrate processing apparatus, a process recipe in which sequences, conditions, and the like of substrate processing to be described below are specified, a cleaning recipe in which sequences, conditions, and the like of a cleaning process to be described below are specified, and the like are readably stored in the memory 121c. The process recipe functions as a program configured to cause the controller 121 to execute each sequence in the substrate processing, which will be described below, to obtain an expected result. The cleaning recipe functions as a program configured to cause the controller 121 to execute each sequence in the cleaning processing, which will be described below, to obtain an expected result. Hereinafter, the process recipe, the cleaning recipe, the control program, and the like may be generally and simply referred to as a "program." Furthermore, the process recipe and the cleaning recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program, data, and the like read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory 121c and execute the same. The CPU 121a is also configured to read the recipe from the memory 121c according to an input of an operation command from the input/output device 122 and the like. Further, the CPU 121a is configured to be capable of controlling, according to contents of the recipe thus read, a flow rate regulating operation of various kinds of gases by the MFCs 241a to 241h, an opening/closing operation of the valves 243a to 243h, the opening/closing operation of the APC valve 244, the pressure regulating operation performed by the APC valve 244 based on the pressure sensor 245, the driving and stopping operation of the vacuum pump 246, the temperature regulating operation performed by the heater 207 based on the temperature sensor 263, the operation of rotating the boat 217 with the rotation mechanism 267 and adjusting a rotation speed of the boat 217, the operation of moving the boat 217 up or down with the boat elevator 115, the operation of opening and closing the shutter 219*s* with the shutter opening/closing mechanism 115*s*, and the like.

The controller 121 may be configured by installing, on the computer, the aforementioned program stored in an external memory 123. Examples of the external memory 123 may include a magnetic disc such as a HDD, an optical disc such as a CD, a magneto-optical disc such as a MO, a semiconductor memory such as a USB memory or a SSD, and the like. The memory 121*c* or the external memory 123 is configured as a non-transitory computer-readable recording medium. Hereinafter, the memory 121*c* and the external memory 123 may be generally and simply referred to as a "recording medium." When the term "recording medium" is used herein, it may indicate a case of including the memory 121*c* only, a case of including the external memory 123 only, or a case of including both the memory 121*c* and the external memory 123. Furthermore, the program may be supplied to the computer by using communication means such as the Internet or a dedicated line, instead of using the external memory 123.

(2) Substrate Processing Process

Figure 4:
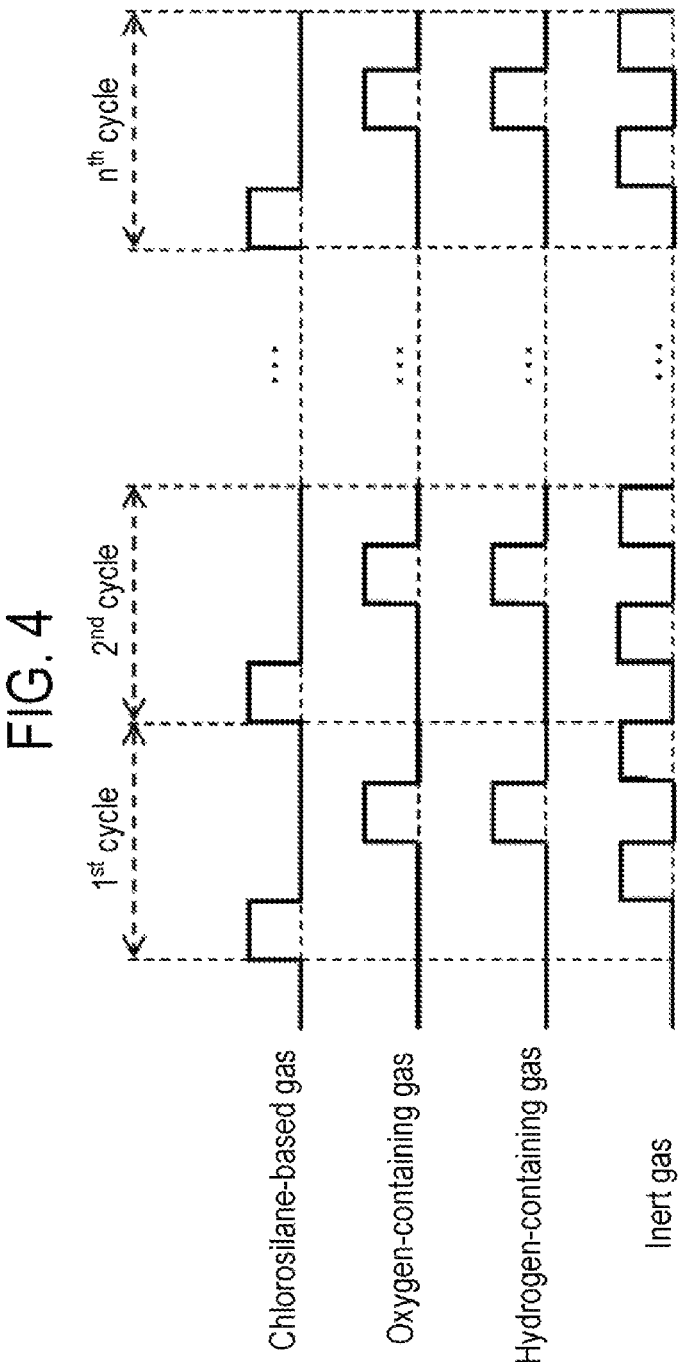
FIG. 4 is a diagram showing timings of gas supply in substrate processing of embodiments of the present disclosure.

As a process of manufacturing a semiconductor device by using the above-described substrate processing apparatus, a sequence example of processing a wafer 200 as a substrate, that is, a film-forming sequence example of forming a film on the wafer 200, will be described mainly with reference to FIG. 4. In the following descriptions, operations of the respective parts constituting the substrate processing apparatus are controlled by the controller 121.

In a film-forming sequence according to the embodiments, a silicon oxide film (SiO film) as a film containing Si and O is formed on a surface of a wafer 200 by performing a cycle a predetermined number of times (n times, where n is an integer of 1 or more), the cycle including non-simultaneously performing:

step S1 of supplying a chlorosilane-based gas as a precursor gas to the wafer 200 in a process chamber 201;

step S2 of removing a residual gas from an interior of the process chamber 201 by purging the interior of the process chamber 201;

step S3 of supplying a H-containing gas and an O-containing gas as an oxidizing gas to the wafer 200 in the process chamber 201; and step S4 of removing a residual gas from the interior of the process chamber by purging the interior of the process chamber 201.

In the present disclosure, for the sake of convenience, the above-described film-forming sequence may be denoted as follows. The same denotation may be used in modifications and other embodiments to be described below.

(Chlorosilane-based gas→purge→O-containing gas+
H-containing gas→purge)×*n*⇒SiO

When the term "wafer" is used herein, it may refer to a wafer itself or a laminated body of a wafer and a predetermined layer or film formed on a surface of the wafer. When the phrase "a surface of a wafer" is used herein, it may refer to a surface of a wafer itself or a surface of a predetermined layer or the like formed on a wafer." When the expression "a predetermined layer is formed on a wafer" is used herein, it may mean that a predetermined layer is directly formed on a surface of a wafer itself or that a predetermined layer is formed on a layer or the like formed on a wafer." When the term "substrate" is used herein, it may be synonymous with the term "wafer."

(Wafer Charging and Boat Loading)

When the boat 217 is charged with a plurality of wafers 200 (wafer charging), the shutter 219*s* is moved by the shutter opening/closing mechanism 115*s* to open the lower end opening of the manifold 209 (shutter opening). Thereafter, as shown in FIG. 1, the boat 217 supporting the wafers 200 is lifted up by the boat elevator 115 and is loaded into the process chamber 201 (boat loading). In this state, the seal cap 219 seals the lower end of the manifold 209 via the 220*b*.

(Pressure Regulation and Temperature Regulation)

After the boat loading is completed, the interior of the process chamber 201, that is, a space where the wafers 200 are located, is vacuum-exhausted (decompression-exhausted) by the vacuum pump 246 to reach a desired pressure (degree of vacuum). In this operation, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to a desired processing temperature. In this operation, a state of supplying electric power to the heater 207 is feedback-controlled based on the temperature information detected by the temperature sensor 263 such that the interior of the process chamber 201 has a desired temperature distribution (temperature regulation). Further, the rotation of the wafers 200 by the rotation mechanism 267 is started. The exhaust of the interior of the process chamber 201 and the heating and rotation of the wafers 200 are continuously performed at least until the processing of the wafers 200 is completed.

(Film Formation)

After that, the following steps S1 to S4 are sequentially performed.

Step S1

In step S1, a chlorosilane-based gas is supplied to the wafer 200 in the process chamber 201.

Specifically, the valve 243*a* is opened to allow the chlorosilane-based gas to flow through the gas supply pipe 232*a*. A flow rate of the chlorosilane-based gas is regulated by the MFC 241*a*, and the chlorosilane-based gas is supplied into the process chamber 201 via the nozzle 249*a* and is exhausted via the exhaust port 231*a*. In this operation, the chlorosilane-based gas is supplied to the wafer 200 (chlorosilane-based gas supply). In this case, the valves 243*f* to 243*h* may be opened to allow an inert gas to be supplied into the process chamber 201 via the nozzles 249*a* to 249*c*, respectively.

Process conditions in this step are exemplified as follows.

Chlorosilane-based gas supply flow rate: 0.005 to 2 slm, specifically 0.05 to 1 slm in some embodiments Chlorosilane-based gas supply time: 1 to 120 seconds, specifically 1 to 60 seconds in some embodiments Processing temperature: 250 to 800 degrees C., specifically 400 to 700 degrees C. in some embodiments Processing pressure: 1 to 2,666 Pa, specifically 67 to 1,333 Pa in some embodiments In the present disclosure, an expression of a numerical range such as "1 to 2,666 Pa" means that a lower limit value and an upper limit value are included in the range. For example, "1 to 2,666 Pa" means "equal to or more than 1 Pa and equal to or less than 2,666 Pa." The same applies to other numerical ranges.

By supplying the chlorosilane-based gas to the wafer 200 under the above-mentioned conditions, a Si-containing layer containing Cl (first layer) is formed on the outermost surface of the wafer 200 as a base. The Si-containing layer containing Cl is formed by physical adsorption or chemical adsorption of molecules of the chlorosilane-based gas, chemical adsorption of molecules of a substance obtained when a portion of the chlorosilane-based gas is decomposed, deposition of Si by thermal decomposition of the chlorosilane-based gas, and the like on the outermost surface of the wafer 200. The Si-containing layer containing Cl may be an adsorption layer (physical adsorption layer or chemical adsorption layer) of molecules of the chlorosilane-based gas or molecules of a substance obtained when a portion of the chlorosilane-based gas is decomposed, or may be a Si deposition layer containing Cl. In the present disclosure, the Si-containing layer containing Cl is also simply referred to as a Si-containing layer.

As the chlorosilane-based gas, it may be possible to use a monochlorosilane (SiH$_3$Cl, abbreviation: MCS) gas, a dichlorosilane (SiH$_2$Cl$_2$, abbreviation: DCS) gas, a trichlorosilane (SiHCl$_3$, abbreviation: TCS) gas, a tetrachlorosilane (SiCl$_4$, abbreviation: STC) gas, a hexachlorodisilane (Si$_2$Cl$_6$, abbreviation: HCDS) gas, an octachlorotrisilane (Si$_3$Cl$_8$, abbreviation: OCTS) gas, or the like. Instead of the chlorosilane-based gas, it may also be possible to use a fluorosilane-based gas such as a tetrafluorosilane (SiF$_4$) gas, a bromosilane-based gas such as a tetrabromosilane (SiBr$_4$) gas, or an iodosilane-based gas such as a tetraiodosilane (SiI$_4$) gas. Further, instead of the chlorosilane-based gas, it may also be possible to use an aminosilane-based gas such as a tetrakis(dimethylamino)silane (Si[N(CH$_3$)$_2$]$_4$, abbreviation: 4DMAS) gas, a tris(dimethylamino)silane (Si[N(CH$_3$)$_2$]$_3$H, abbreviation: 3DMAS) gas, a bis(diethylamino)silane (Si[N(C$_2$H$_5$)$_2$]$_2$H$_2$, abbreviation: BDEAS) gas, a bis(tert-butylamino)silane (SiH$_2$[NH(C$_4$H$_9$)]$_2$, abbreviation: BTBAS) gas, or a (diisopropylamino)silane (SiH$_3$[N(C$_3$H$_7$)$_2$], abbreviation: DIPAS) gas.

As the inert gas, it may be possible to use a rare gas such as a nitrogen (N$_2$) gas, an argon (Ar) gas, a helium (He) gas, a neon (Ne) gas, and a xenon (Xe) gas. The same applies to each step to be described later.

Step S2

After the Si-containing layer is formed on the wafer 200, the valve 243$a$ is closed to stop the supply of the chlorosilane-based gas into the process chamber 201. Then, the interior of the process chamber 201 is vacuum-exhausted to remove a gas and the like remaining in the process chamber 201 from the interior of the process chamber 201. In this operation, the valves 243$f$ to 243$h$ are opened to allow an inert gas as a purge gas to be supplied into the process chamber 201 to purge the interior of the process chamber 201 with the inert gas (purging).

Process conditions in this step are exemplified as follows.
Inert gas supply flow rate: 0.1 to 20 slm
Inert gas supply time: 1 to 120 seconds, specifically 1 to 60 seconds in some embodiments
Other process conditions are the same as the process conditions in step S1.

Step S3

After the purge of the interior of the process chamber 201 is completed, an O-containing gas and a H-containing gas are supplied to the wafer 200 in the process chamber 201, that is, the Si-containing layer formed on the wafer 200.

Specifically, the valves 243$c$ and 243$e$ are opened to allow the O-containing gas and the H-containing gas to flow through the gas supply pipes 232$c$ and 232$e$, respectively. Flow rates of the O-containing gas and the H-containing gas are regulated by the MFCs 241$c$ and 241$e$, respectively, and the O-containing gas and the H-containing gas are supplied into the process chamber 201 via the nozzles 249$c$ and 249$b$, respectively and are exhausted via the exhaust port 231$a$. In this operation, the O-containing gas and the H-containing gas are supplied to the wafer 200 at the same time and together (O-containing gas and H-containing gas supply). At this time, the valves 243$f$ to 243$h$ may be opened to allow an inert gas to be supplied into the process chamber 201 via the nozzles 249$a$ to 249$c$, respectively.

Process conditions in this step are exemplified as follows.
O-containing gas supply flow rate: 0.1 to 10 slm
H-containing gas supply flow rate: 0.1 to 10 slm
Each gas supply time: 1 to 120 seconds, specifically 1 to 60 seconds in some embodiments
Processing pressure: 13.3 to 1,333 Pa, specifically 13.3 to 399 Pa in some embodiments
Other process conditions are the same as the process conditions in step S1.

By supplying the O-containing gas and the H-containing gas into the process chamber 201 at the same time and together, these gases are thermally activated (excited) under a non-plasma atmosphere and under a heated and decompressed atmosphere to react with each other, whereby water (H$_2$O)-free oxidizing species containing oxygen, such as atomic oxygen (O), is generated. Then, mainly by this oxidizing species, an oxidation process is performed on the Si-containing layer formed on the wafer 200 in step S1. Since an energy of this oxidizing species is higher than a bonding energy of a Si—Cl bond and the like contained in the Si-containing layer, the Si—Cl bond and the like contained in the Si-containing layer are separated by giving the energy of this oxidizing species to the Si-containing layer. Cl and the like cut from the bonding with Si are removed from the layer and are discharged as Cl$_2$, HCl, and the like. Further, the bonding hand of Si left after the bonding with Cl or the like is cut is bonded to O contained in the oxidizing species to form a Si—O bond. In this way, the Si-containing layer is changed (modified) into a layer containing Si and O and having a low content of impurities such as Cl, that is, a high-purity SiO layer (second layer). According to this oxidation process, an oxidizing power can be significantly improved as compared with a case where an O-containing gas is supplied alone or a case where a H$_2$O gas (water vapor) is supplied alone. That is, by adding the H-containing gas to the O-containing gas under the decompressed atmosphere, an effect of significantly improving the oxidizing power can be obtained as compared with the case of supplying the O-containing gas alone or the case of supplying the H$_2$O gas alone.

As the O-containing gas, it may be possible to use an oxygen (O$_2$) gas, a nitrous oxide (N$_2$O) gas, a nitric oxide (NO) gas, a nitrogen dioxide (NO$_2$) gas, an ozone (O$_3$) gas, a H$_2$O gas, a carbon monoxide (CO) gas, a carbon dioxide (CO$_2$) gas, or the like.

As the H-containing gas, it may be possible to use a H$_2$ gas, a deuterium (D$_2$) gas, or the like.

Further, when an aminosilane-based gas is used instead of the chlorosilane-based gas in step S1, in this step (step S3), an oxidizing gas (oxidizing agent) such as an O$_3$ gas may be supplied alone as the O-containing gas without supplying the H-containing gas.

Step S4

After the Si-containing layer formed on the wafer 200 is changed into the SiO layer, the valves 243$c$ and 243$e$ are closed to stop the supply of the O-containing gas and the H-containing gas into the process chamber 201, respectively. Then, according to the same process procedures and process conditions as step S2, a gas and the like remaining in the process chamber 201 are removed from the interior of the process chamber 201 to purge the interior of the process chamber 201 with an inert gas (purging).

[Performing Predetermined Number of Times]

By performing a cycle a predetermined number of times (n times, where n is an integer of 1 or more), the cycle including non-simultaneously, that is, without synchronization, performing the above-described steps S1 to S4, a SiO film having a desired film thickness can be formed on the wafer 200. The above-mentioned cycle may be performed multiple times. That is, a thickness of a SiO layer formed per cycle may be set to be smaller than the desired film thickness, and the above-mentioned cycle may be performed multiple times until a film thickness of a SiO film formed by stacking the SiO layers reaches the desired film thickness.

(After-Purge and Returning to Atmospheric Pressure)

After the film formation is completed, an inert gas is supplied into the process chamber 201 from each of the nozzles 249*a* to 249*c* and is exhausted via the exhaust port 231*a*. Thus, the interior of the process chamber 201 is purged to remove a gas, reaction by-products, and the like remaining in the process chamber 201 from the interior of the process chamber 201 (after-purge). Thereafter, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved such that the lower end opening of the manifold 209 is sealed by the shutter 219*s* via the O-ring 220*c* (shutter closing). The processed wafers 200 are unloaded from the reaction tube 203 and are discharged from the boat 217 (wafer discharging).

(3) Cleaning Process

When the above-described substrate processing, that is, the process on the wafer 200, is performed, a substance containing Si and O, for example, a deposit containing a silicon oxide such as a SiO film, adheres to surfaces of members in the process container, for example, an inner wall surface of the reaction tube 203, a surface of the boat 217, and the like. Therefore, by using the above-described substrate processing apparatus, as a process of manufacturing a semiconductor device, a cleaning process of removing a substance containing Si and O adhering to the interior of the process container (which is hereinafter referred to as an adhering substance) is performed after performing the above-described process on the wafer 200 a predetermined number of times (once or more). Hereinafter, a sequence example of cleaning the interior of the process container after performing the process on the wafer 200 will be described mainly with reference to FIG. 5. Also in the following description, the operations of the respective parts constituting the substrate processing apparatus are controlled by the controller 121.

In the cleaning sequence in the embodiments, a step (etching) of removing a substance adhering to the interior of a process container is performed by performing a cycle a predetermined number of times (m times, where m is an integer of 1 or more) under a first temperature, the cycle including:

step a of supplying one gas of a N- and H-containing gas and a F-containing gas into the process container after a wafer 200 is processed; and step b of supplying the other gas different from the one of the N- and H-containing gas and the F-containing gas into the process container in which the one gas remains.

Further, in the embodiments, as an example, a case where the N- and H-containing gas is supplied as the one gas in step a and the F-containing gas is supplied as the other gas in step b will be described.

Further, in the embodiments, as an example, a case where the interior of the process container is filled with the N- and H-containing gas in step a, and the F-containing gas is mixed with the N- and H-containing gas that has filled the interior of the process container in step b will be described. Further, in the embodiments, as an example, a case where the supply of the F-containing gas into the process container is started after the supply of the N- and H-containing gas into the process container is stopped, in step b, will be described. Further, in the embodiments, as an example, in step b, a case where step b1 of supplying the F-containing gas into the process container in a state where exhaust of the interior of the process container is stopped, and step b2 of supplying the F-containing gas into the process container in a state where the exhaust of the interior of the process container is performed, will be described.

Further, in the embodiments, as an example, a case where the N- and H-containing gas is supplied into the process container in a state where the exhaust of the interior of the process container is performed, in step a, will be described.

Further, in the embodiments, as an example, in the above-described cycle, a case where step c of exhausting the interior of the process container is further performed in a state where the supply of the N- and H-containing gas and the F-containing gas into the process container is stopped will be described. Further, in the embodiments, as an example, a case where an inert gas is supplied into the process chamber 201 to purge the interior of the process chamber 201 with the inert gas in step c will be described.

Further, in the embodiments, as an example, a case where step d (sublimation) of sublimating by-products remaining in the process container after the above-described etching is performed, of by-products generated when the above-described etching is performed, by heating and exhausting the interior of the process container at a second temperature equal to or higher than the first temperature after performing the above-described etching is further performed will be described.

In the present disclosure, for the sake of convenience, the above-described cleaning sequence may be denoted as follows. The same denotation is used in modifications and other embodiments to be described below.

$$(\text{N- and H-containing gas}\rightarrow\text{F-containing gas}\rightarrow\text{purge})\times m\Rightarrow\text{sublimation}$$

(Boat Loading)

The shutter 219*s* is moved by the shutter opening/closing mechanism 115*s* to open the lower end opening of the manifold 209 (shutter open). Then, an empty boat 217 having a substance containing Si and O adhering to a surface thereof, that is, the boat 217 not holding the wafer 200, is lifted up by the boat elevator 115 and is loaded into the process container having a substance containing Si and O adhering to the surface thereof, that is, into the process chamber 201. In this state, the seal cap 219 seals the lower end of the manifold 209 via the O-ring 220*b*.

(Pressure Regulation and Temperature Regulation)

After the boat loading is completed, the interior of the process chamber 201 is vacuum-exhausted (decompression-exhausted) by the vacuum pump 246 to reach a desired pressure (degree of vacuum). At this time, an internal pressure of the process chamber 201 is measured by the pressure sensor 245, and the APC valve 244 is feedback-controlled based on the measured pressure information (pressure regulation). Further, the interior of the process chamber 201 is heated by the heater 207 to have a desired processing temperature. In this operation, a state of supplying electric power to the heater 207 is feedback-controlled based on the temperature information detected by the temperature sensor 263 so that the interior of the process chamber 201 has a desired temperature distribution (temperature regulation). Further, the rotation of the boat 217 by the rotation mechanism 267 is started. The operation of the vacuum pump 246, the heating of the interior of the process chamber 201, and the rotation of the boat 217 are all continuously performed at least until the cleaning process is completed. The boat 217 may not be rotated.

(Etching)

Thereafter, the next steps a to c are sequentially executed.

Step a

In step a, the N- and H-containing gas is supplied into the process chamber 201 in a state where exhaust of the interior of the process chamber 201 is performed.

Specifically, with the APC valve 244 opened and the interior of the process chamber 201 exhausted, the valve 243*b* is opened to allow the N- and H-containing gas to flow through the gas supply pipe 232*b*. The flow rate of the N- and H-containing gas is regulated by the MFC 241*b*, and the N- and H-containing gas is supplied into the process chamber 201 via the nozzle 249*b* and is exhausted via the exhaust port 231*a* (N- and H-containing gas supply). In this operation, the valves 243*f* to 243*h* may be opened to allow the inert gas to be supplied into the process chamber 201 via the nozzles 249*a* to 249*c*, respectively.

Process conditions in this step are exemplified as follows.

Figure 5:
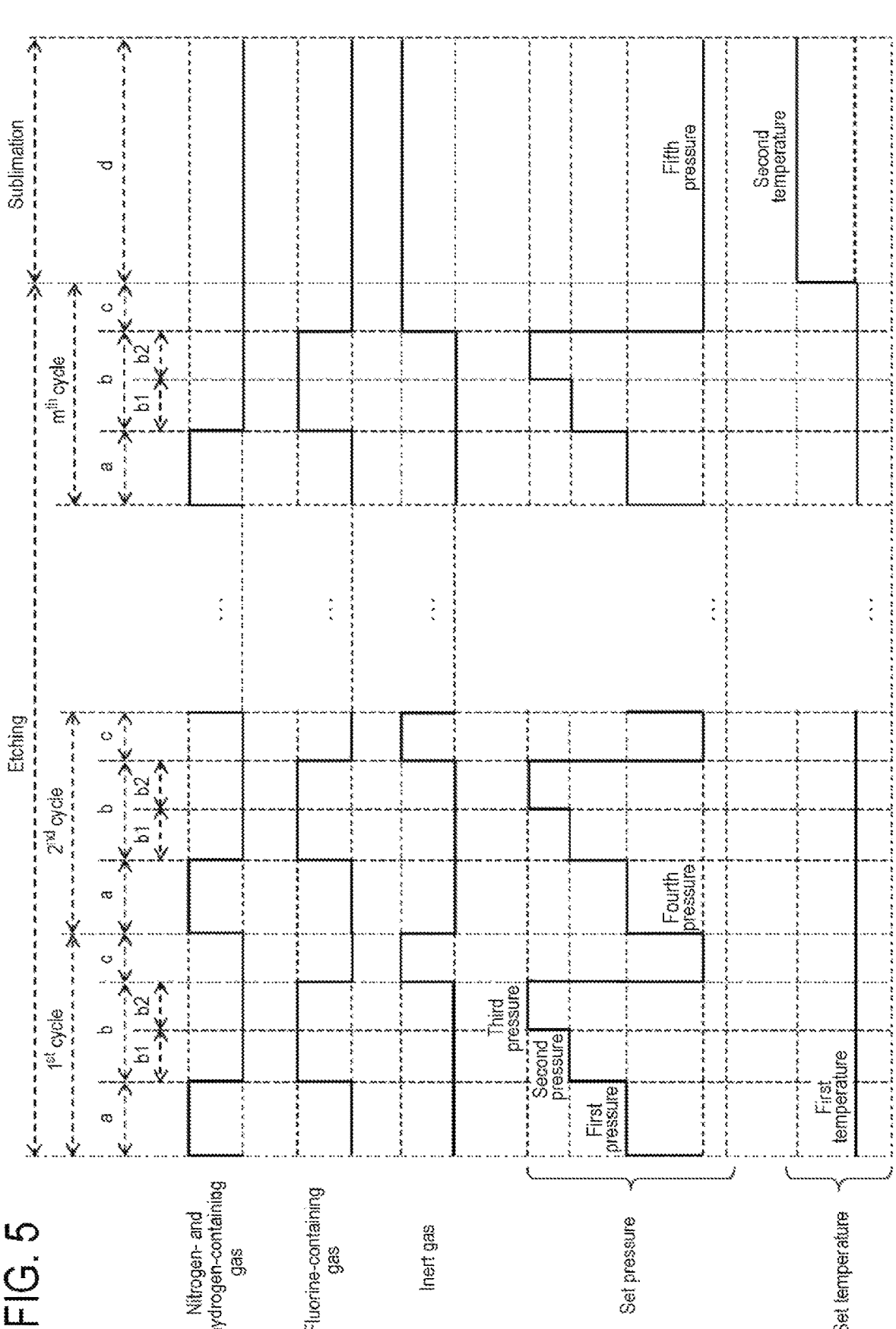
FIG. 5 is a diagram showing timings of gas supply, and a set pressure and a set temperature in a process chamber in a cleaning process of embodiments of the present disclosure.

N- and H-containing gas supply flow rate: 0.1 to 20 slm, specifically 1 to 10 slm in some embodiments Inert gas supply flow rate: 0 to 50 slm, specifically 0 to 10 slm in some embodiments Each gas supply time: 1 second to 60 minutes, specifically 10 seconds to 30 minutes in some embodiments Processing pressure (first pressure): 1 to 39,900 Pa, specifically 1 to 13,300 Pa in some embodiments Processing temperature (first temperature): 20 to 400 degrees C., specifically 50 to 150 degrees C. in some embodiments The pressure and temperature shown in FIG. 5 are examples of set pressure and set temperature, that is, control target values, respectively, for the sake of convenience. Actual pressure and temperature of the interior of the process chamber 201 are not limited to constant values shown in FIG. 5, but may change over time to reach the above-mentioned target values.

By performing this step under the above-mentioned process procedure and process conditions, it is possible to fill the interior of the process chamber 201 with the N- and H-containing gas to spread the N- and H-containing gas over the entire area of the process chamber 201.

After a predetermined time elapses, the supply of the N- and H-containing gas into the process chamber 201 is stopped.

As the N- and H-containing gas, it may be possible to use a hydrogen nitride-based gas such as an ammonia ($NH_3$) gas, a diazene ($N_2H_2$) gas, a hydrazine ($N_2H_4$) gas, or a $N_3H_8$ gas.

Step b1

After step a is completed, in a state where the exhaust of the interior of the process chamber 201 is stopped, a F-containing gas is supplied into the process chamber 201 in which the N- and H-containing gas remains.

Specifically, the APC valve 244 is fully closed to stop the exhaust of the interior of the process chamber 201. Then, the valve 243*d* is opened to allow the F-containing gas to flow through the gas supply pipe 232*d*. A flow rate of the F-containing gas is regulated by the MFC 241*d*, and the F-containing gas is supplied into the process chamber 201 via the nozzle 249*a* (F-containing gas supply). In this operation, the valves 243*f* to 243*h* may be opened to allow an inert gas to be supplied into the process chamber 201 via the nozzles 249*a* to 249*c*, respectively.

Process conditions in this step are exemplified as follows.

F-containing gas supply flow rate: 0.1 to 10 slm, specifically 1 to 3 slm in some embodiments Inert gas supply flow rate: 0 to 50 slm, specifically 0 to 10 slm in some embodiments Each gas supply time: 1 second to 60 minutes, specifically 10 seconds to 10 minutes in some embodiments Processing pressure (second pressure): a pressure higher than the first pressure, for example, 5 to 39,900 Pa, specifically 5 to 26,600 Pa in some embodiments Other process conditions are the same as those in step a.

By performing this step under the above-mentioned process procedure and process conditions, it is possible to mix the F-containing gas with the N- and H-containing gas that has filled the interior of the process chamber 201 by performing step a. Further, it is possible to raise the internal pressure of the process chamber 201 to the second pressure higher than the first pressure. As a result, it is possible to cause the mixture of the N- and H-containing gas and the F-containing gas to react with the adhering substance in the process chamber 201 such that the etching of the adhering substance proceeds. As the etching proceeds, a H- and O-containing substance such as $H_2O$ may be produced in the process chamber 201 due to the reaction between the mixture of the N- and H-containing gas and the F-containing gas and the adhering substance in the process chamber 201. This H- and O-containing substance such as $H_2O$ has an action of promoting the etching action. Further, as the etching proceeds, gaseous by-products containing silicon tetrafluoride ($SiF_4$), hexafluorosilicic acid ($H_2SiF_6$), ammonium hexafluorosilicate (($NH_4)_2SiF_6$), and the like may be produced in the process chamber 201. These by-products may be a factor that reduces an etching efficiency of deposits in the process chamber 201.

As the F-containing gas, it may be possible to use a fluorine ($F_2$) gas, a chlorine trifluoride ($ClF_3$) gas, a chlorine monofluoride (ClF) gas, a nitrogen trifluoride ($NF_3$) gas, a hydrogen fluoride (HF) gas, or the like.

Step b2

After step b1 is completed, in a state where the exhaust of the interior of the process chamber 201 is performed, a F-containing gas is supplied into the process chamber 201 where the mixture of the N- and H-containing gas and the F-containing gas and the gaseous by-products remain.

Specifically, the APC valve 244 is opened to have a predetermined opening degree, and the exhaust of the interior of the process chamber 201 is started. Then, with the valve 243*d* kept open, the supply of the F-containing gas into the gas supply pipe 232*d* is continued. A flow rate of the F-containing gas is regulated by the MFC 241*d*, and the F-containing gas is continuously supplied into the process chamber 201 via the nozzle 249*a* and is exhausted via the exhaust port 231*a* together with various gases and gaseous by-products that have filled the inside of the process chamber 201 (F-containing gas supply). In this operation, the valves 243*f* to 243*h* may be opened to allow an inert gas to be supplied into the process chamber 201 via the nozzles 249*a* to 249*c*, respectively.

Process conditions in this step are exemplified as follows.

Each gas supply time: 1 second to 5 minutes, specifically 10 seconds to 1 minute in some embodiments Processing pressure (third pressure): a pressure equal to or higher than the second pressure, for example, 10 to 39,900 Pa, specifically 10 to 26,600 Pa in some embodiments Other process conditions are the same as those in step a.

By performing this step under the above-mentioned process procedure and process conditions, it is possible to further promote the reaction between the mixture of the N- and H-containing gas and the F-containing gas and the adhering substance in the process chamber 201 such that the etching of the adhering substance further proceeds. Further, it is possible to discharge (remove) the gaseous by-products produced as the etching of the adhering substance proceeds from the interior of the process chamber 201.

After a predetermined time elapses, the valve 243*d* is closed to stop the supply of the F-containing gas into the process chamber 201.

Step c

After step b2 is completed, in a state where the supply of the N- and H-containing gas and the F-containing gas into the process chamber 201 is stopped, the interior of the process chamber 201 is exhausted and an inert gas is further supplied into the process chamber 201.

Specifically, the APC valve 244 is fully opened to continue the exhaust of the interior of the process chamber 201. Then, the valves 243*f* to 243*h* are opened to allow an inert gas as a purge gas to flow through the gas supply pipes 232*f* to 232*h*, respectively. A flow rate of the inert gas is regulated by the MFCs 241*f* to 241*h*, and the inert gas is supplied into the process chamber 201 via the nozzles 249*a* to 249*c* and is exhausted via the exhaust port 231*a* together with various gases and gaseous by-products remaining in the process chamber 201 (purge gas supply).

Process conditions in this step are exemplified as follows.

Inert gas supply flow rate: 0.1 to 50 slm, specifically 1 to 20 slm in some embodiments Gas supply time: 1 second to 30 minutes, specifically 5 seconds to 5 minutes in some embodiments Processing pressure (fourth pressure): a pressure lower than the third pressure, specifically a pressure lower than the second pressure, more specifically a pressure lower than the first pressure, for example, 0.1 to 26,600 Pa, specifically 0.1 to 13,300 Pa in some embodiments Other process conditions are the same as those in step a.

By performing this step under the above-mentioned process procedure and process conditions, it is possible to remove the N- and H-containing gas and the F-containing gas remaining in the process chamber 201, and the gaseous by-products and the like produced as the etching of the adhering substance proceeds from the interior of the process chamber 201.

[Performing Predetermined Number of Times]

By performing a cycle a predetermined number of times (m times, where m is an integer of 1 or more), the cycle including non-simultaneously, that is, without synchronization, performing the above-described steps a to c, that is, steps a, b1, b2, and c, it is possible to remove the adhering substance in the process chamber 201.

(Sublimation)

As described above, at least a portion of the gaseous by-products produced as the etching proceeds are removed from the process chamber 201 by performing a cycle, which includes step b2 and step c, a predetermined number of times. However, a portion of the gaseous by-products may adhere to surfaces of members in the process chamber 201 to be solidified, such that they remain in the process chamber 201. Therefore, after the etching is completed, the interior of the process chamber 201 is heated under the second temperature equal to or higher than the first temperature to perform a process of sublimating the by-products to remove the solid by-products (for example, fluoride such as $SiF_4$) remaining in the process chamber 201.

Specifically, an output of the heater 207 is regulated to change the internal temperature of the process chamber 201 to a temperature equal to or higher than the internal temperature (the first temperature) of the process chamber 201 in the etching. Then, the APC valve 244 is fully opened to exhaust the interior of the process chamber 201. In this operation, the valves 243*f* to 243*h* are opened to allow an inert gas as a purge gas to flow into the gas supply pipes 232*f* to 232*h*. The flow rate of the inert gas is regulated by MFCs 241*f* to 241*h*, and the inert gas is supplied into the process chamber 201 via the nozzles 249*a* to 249*c* and is exhausted via the exhaust port 231*a* together with the by-products that have become gaseous due to the sublimation (purge gas supply).

Process conditions in this step are exemplified as follows.

Inert gas supply time: 1 second to 300 minutes, specifically 5 to 5 minutes in some embodiments.

Processing pressure (fifth pressure): a pressure lower than the third pressure, specifically a pressure lower than the second pressure, more specifically a pressure lower than the first pressure, for example, 0.1 to 26,600 Pa, specifically 0.1 to 13,300 Pa in some embodiments Processing temperature (second temperature): a temperature equal to or higher than the first temperature, specifically a temperature higher than the first temperature, for example, 100 to 800 degrees C., specifically 300 to 500 degrees C. in some embodiments By performing this step under the above-mentioned process procedure and process conditions, it is possible to sublimate the by-products remaining in the process chamber 201 due to adsorption and solidification on the surfaces of members in the process chamber 201, thereby removing the by-products from the process chamber 201.

(After-Purge and Returning to Atmospheric Pressure)

After the sublimation is completed, an inert gas is supplied into the process chamber 201 from each of the nozzles 249*a* to 249*c* and is exhausted via the exhaust port 231*a*. As a result, the interior of the process chamber 201 is purged to remove a gas, by-products, and the like remaining in the process chamber 201 after the sublimation from the process chamber 201 (after-purge). Then, the internal atmosphere of the process chamber 201 is substituted with the inert gas (inert gas substitution) and the internal pressure of the process chamber 201 is returned to the atmospheric pressure (returning to atmospheric pressure).

(Boat Unloading)

Thereafter, the seal cap 219 is moved down by the boat elevator 115 to open the lower end of the manifold 209 (boat unloading). After the boat unloading, the shutter 219*s* is moved and the lower end opening of the manifold 209 is sealed by the shutter 219*s* via the O-ring 220*c* (shutter close). Then, the above-described substrate processing is restarted.

(4) Effects of the Embodiments

According to the embodiments, one or more effects set forth below may be achieved.

(a) By performing a cycle a predetermined number of times under the first temperature, the cycle including step a of supplying the N- and H-containing gas into the process container after the wafer 200 is processed and step b of supplying the F-containing gas into the process container where the N- and H-containing gas remains, it is possible to etch an adhering substance in the process container more efficiently than a case where the F-containing gas is alone supplied into the process container. As a result, it is possible to shorten a cleaning time of the interior of the process container and improve a productivity of substrate processing by shortening a downtime of the substrate processing apparatus. Further, by regulating the number of cycles or the like, it is possible to improve a controllability of a removal amount (etching amount) of the adhering substance. Further, by improving the etching efficiency, it is possible to reduce an amount of cleaning gas used when etching the adhering substance in the process container.

(b) By filling the interior of the process container with the N- and H-containing gas in step a and mixing the F-containing gas with the N- and H-containing gas that has filled the interior of the process container in step b, it is possible to efficiently etch the adhering substance in the process container, thereby shortening the cleaning time. Further, it is possible to uniformly clean the entire region inside the process container to every corner.

(c) By starting the supply of the F-containing gas into the process container after stopping the supply of the N- and H-containing gas into the process container in step b, it is possible to more improve the controllability of the etching amount of the adhering substance in the process container than a case where the supply of the N- and H-containing gas and the supply of the F-containing gas into the process container overlap.

(d) By supplying the F-containing gas into the process container in the state where the exhaust of the interior of the process container is stopped in step b1, it is possible to reduce the amount of the cleaning gas used when etching the adhering substance in the process container. Further, it is possible to quickly increase the internal pressure of the process container, which can result in shortening the cleaning time. Further, it is possible to uniformly clean the entire region inside the process container to every corner.

(e) By supplying the F-containing gas into the process container in the state where the exhaust of the interior of the process container is performed in step b2, it is possible to remove the gaseous by-products produced as the etching of the adhering substance proceeds from the process container, thereby suppressing a decrease in etching efficiency of the adhering substance due to an influence of the by-products.

(f) By supplying the N- and H-containing gas into the process container in the state where the exhaust of the interior of the process container is performed in step a, it is possible to clean the interior of the process container with the N- and H-containing gas. Further, depending on the process conditions in step a, it may be possible to nitride at least a portion of the adhering substance in the process container. As a result, it is possible to etch the adhering substance efficiently.

(g) By exhausting the interior of the process container in the state where the supply of the N- and H-containing gas and the F-containing gas into the process container is stopped in step c, it is possible to remove the gaseous by-products produced as the etching of the adhering substance in the process container proceeds from the process container, thereby suppressing the decrease in the etching efficiency of the adhering substance due to the influence of the by-products.

(h) By performing step d of heating the interior of the process container under the second temperature equal to or higher than the first temperature after performing the etching, it is possible to sublimate the by-products remaining in the process container. This makes it possible to promote the removal of the by-products from the process container, thereby suppressing the decrease in etching efficiency of the adhering substance due to the influence of the by-products.

Further, by setting the interior of the process container to the second temperature higher than the first temperature in step d, it is possible to further enhance the effects described herein.

Further, by purging the interior of the process container with the inert gas in step d, it is possible to efficiently remove the sublimated by-products from the process container, thereby enhancing the effects described herein.

(i) By setting the processing pressure in step a as the first pressure, the processing pressure in step b1 as the second pressure higher than the first pressure, and the processing pressure in step b2 as the third pressure equal to or higher than the second pressure, it is possible to improve the etching efficiency of the adhering substance. Further, by setting the processing pressure in step b2 as the third pressure equal to or higher than the second pressure, it is possible to suppress re-adhesion of the etched adhering substance in the process container. As a result, it is possible to shorten the cleaning time.

(j) By setting the first to third pressures as in the above-described various embodiments and setting the processing pressure in step c to the fourth pressure lower than the third pressure, it is possible to improve the etching efficiency of the adhering substance. That is, it is possible to enhance the efficiency of removing the gaseous by-products produced as the etching of the adhering substance proceeds from the process container and suppress this substance from adhering to the interior of the process container, thereby maintaining the etching efficiency of the adhering substance high. As a result, it is possible to shorten the cleaning time. By making the fourth pressure lower than the third pressure, it is possible to sufficiently obtain the effects described herein. Further, by making the fourth pressure lower than the second pressure, it is possible to further enhance the effects described herein. Further, by making the fourth pressure lower than the first pressure, it is possible to further enhance the effects described herein.

(k) By setting the first to fourth pressures as in the above-described various embodiments and setting the processing pressure in step d to the fifth pressure lower than the third pressure, it is possible to improve the etching efficiency of the adhering substance. That is, it is possible to enhance the efficiency of removing the gaseous by-products produced as the etching of the adhering substance proceeds from the process container and suppress this substance from adhering to the process container, thereby maintaining the etching efficiency of the adhering substance high. As a result, it is possible to shorten the cleaning time. Further, by making the fifth pressure lower than the third pressure, it is possible to sufficiently obtain the effects described herein. Further, by making the fifth pressure lower than the second pressure, it is possible to further enhance the effects described herein. Further, by making the fifth pressure lower than the first pressure, it is possible to further enhance the effects described herein.

(l) By making the supply flow rate of the N- and H-containing gas in step a larger than the supply flow rate of the F-containing gas in step b, it is possible to efficiently etch the adhering substance in the process container, thereby shortening the cleaning time.

(m) By making the supply time of the N- and H-containing gas in step a longer than the supply time of the F-containing gas in step b, it is possible to efficiently etch the adhering substance in the process container, thereby shortening the cleaning time.

(n) In etching, by using the N- and H-containing gas as the one gas and using the F-containing gas as the other gas, one or more of the above-mentioned effects may be remarkably obtained.

(o) In etching, by using at least one selected from the group of a $NH_3$ gas, a $N_2H_2$ gas, a $N_2H_4$ gas, and a $N_3H_8$ gas as the one gas and using at least one selected from the group of a $F_2$ gas, a $ClF_3$ gas, a $ClF$ gas, a $NF_3$ gas, and a $HF$ gas as the other gas, one or more of the above-mentioned effects may be more remarkably obtained.

(p) In etching, by using a $NH_3$ gas as the one gas and using a $HF$ gas as the other gas, one or more of the above-mentioned effects may be remarkably obtained. In particular, when the HF gas is used as the other gas, water ($H_2O$) may be generated in the process container when the etching reaction proceeds in steps b1 and b2. This water may be used to promote the etching of the adhering substance in the process container. In this case, the above-mentioned first temperature may be a low temperature that makes it difficult for the generated water to be removed from the process container.

(q) The above-mentioned one or more effects may be particularly remarkably obtained in a case where the substance adhering to the process container by processing the wafer 200 is a substance containing Si and O, for example including a silicon oxide (SiO film).

(r) Since the etching of the embodiments is performed in a non-plasma atmosphere, it is possible to improve the controllability of the etching amount of the adhering substance in the process container. Further, since the sublimation of the embodiments is performed in a non-plasma atmosphere, it is possible to avoid plasma damage to the members in the process container.

(s) The above-mentioned effects may be similarly obtained even when the above-mentioned various silane-based gases, the above-mentioned O-containing gas, and the above-mentioned H-containing gas are used in the substrate processing, when the above-mentioned N- and H-containing gas and the above-mentioned F-containing gas are used in the cleaning process, and when the above-mentioned various inert gases are used in each of the substrate processing and the cleaning process.

(5) Modifications

The sequence of cleaning process in the embodiments may be changed as described in the following modifications. These modifications may be used in proper combination. Unless otherwise stated, the process procedure and process conditions in each step of each modification may be the same as the process procedure and process conditions in each step of the above-described cleaning process.

First Modification

As in the cleaning sequence described below, the F-containing gas may be supplied as one gas of the N- and H-containing gas and the F-containing gas in step a, and the N- and H-containing gas may be supplied as the other gas different from the one gas of the N- and H-containing gas and the F-containing gas in step b. Even in this case, at least some of the effects described in the above-described embodiments may be obtained.

$$(\text{F-containing gas} \rightarrow \text{N- and H-containing gas} \rightarrow \text{purge}) \times m \rightarrow \text{sublimation}$$

(Second Modification)

As in the cleaning sequence described below, step c may not be performed in each cycle. Even in this case, at least some of the effects described in the above-described embodiments may be obtained.

$$(\text{N- and H-containing gas} \rightarrow \text{F-containing gas}) \times m \rightarrow \text{sublimation}$$

$$(\text{F-containing gas} \rightarrow \text{N- and H-containing gas}) \times m \rightarrow \text{sublimation}$$

Third Modification

As in the cleaning sequence described below, purging of the interior of the process container may be performed at the timing between step a and step b (step b1) in each cycle. The purging at the timing between steps a and b may be performed in the same process procedure and process conditions as those in the above-described step c. Even in this case, at least some of the effects described in the above-described embodiments may be obtained. Further, in this modification, since a mixing amount of the N- and H-containing gas and the F-containing gas is reduced, a reaction between them may be suppressed such that a fine amount can be etched. Therefore, this modification may be particularly effective when the thickness of the adhering substance in the process container is thin.

$$(\text{N- and H-containing gas} \rightarrow \text{purge} \rightarrow \text{F-containing gas}) \times m \rightarrow \text{sublimation}$$

$$(\text{F-containing gas} \rightarrow \text{purge} \rightarrow \text{N- and H-containing gas}) \times m \rightarrow \text{sublimation}$$

$$(\text{N- and H-containing gas} \rightarrow \text{purge} \rightarrow \text{F-containing gas} \rightarrow \text{purge}) \times m \rightarrow \text{sublimation}$$

$$(\text{F-containing gas} \rightarrow \text{purge} \rightarrow \text{N- and H-containing gas} \rightarrow \text{purge}) \times m \rightarrow \text{sublimation}$$

Fourth Modification

As in the cleaning sequence described below, the etching and the sublimation may be repeated (hereinbelow, m is an integer of 1 or more and p is an integer of 2 or more). Even in this case, at least some of the effects described in the above-described embodiments may be obtained. Further, this modification is particularly effective when the adhering substance in the process container is thick.

[(N- and H-containing gas→F-containing
gas→purge)×$m$→sublimation]×$p$

[(F-containing gas→N- and H-containing
gas→purge)×$m$→sublimation]×$p$

Other Embodiments of the Present Disclosure

The embodiments of the present disclosure have been specifically described above. However, the present disclosure is not limited to the above-described embodiments, but may be changed in various ways without departing from the gist thereof.

In the above-described embodiments, the case where the sublimation is performed after the etching is performed in the cleaning process has been described as an example, but the present disclosure is not limited thereto, but the sublimation, that is, step d, may not be performed. Even in this case, at least some of the effects described in the above-described embodiments may be obtained. In particular, according to the above-described embodiments, since step c is performed in each cycle. Therefore, it is possible to sufficiently remove the by-products produced as the etching proceeds from the process container in step c performed in each cycle without performing an additional step such as the sublimation process, depending on the process conditions in step c.

In the above-described embodiments, the case where, after the N- and H-containing gas is supplied in step a, the F-containing gas is supplied in the state where the exhaust of the interior of the process container is stopped in step b1 and the F-containing gas is supplied in this state where the exhaust of the interior of the process container is performed in step b2 has been described as an example, but the present disclosure is not limited thereto. For example, after step a is performed, step b2 may be performed without performing step b1. Even in this case, at least some of the effects described in the above-described embodiments may be obtained.

In the above-described embodiments, the case where the supply of the N- and H-containing gas into the process container is stopped and then the supply of the F-containing gas into the process container is started in step b has been described as an example, but the present disclosure is not limited thereto. For example, at least some of the supply of the N- and H-containing gas in step a and the supply of the F-containing gas in step b may overlap. Even in this case, at least some of the effects described in the above-described embodiments can be obtained. In this case, the etching rate may be further increased, thereby improving the etching efficiency. As a result, it is possible to further shorten the cleaning time.

Further, in the above-described embodiments, the example of forming the SiO film on the wafer 200 in the substrate processing has been described. However, the present disclosure is not limited thereto. For example, the above-described cleaning process may be suitably applied even when a Si-based oxide film such as a silicon oxycarbide film (SiOC film), a silicon oxycarbonitride film (SiOCN film), or a silicon oxynitride film (SiON film) is formed on the wafer 200 in the substrate processing. Further, the above-described cleaning process may be suitably applied even when a metal-based oxide film such as a titanium oxide film (TiO film), an aluminum oxide film (AlO film), a hafnium oxide film (HfO film), or a zirconium oxide film (ZrO film) is formed on the wafer 200. Even in these cases, at least some of the effects described in the above-described embodiments may be obtained.

Recipes used in each process may be provided individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time has been described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, an example in which a film is formed by using a substrate processing apparatus provided with a hot-wall-type process furnace has been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same process procedures and process conditions as those in the above-described embodiments, and the same effects as those of the above-described embodiments are achieved.

The above-described embodiments may be used in proper combination. The process procedures and process conditions used in this case may be the same as, for example, the process procedures and process conditions in the above-described embodiments.

EXAMPLES

As an Example, by using the substrate processing apparatus shown in FIG. 1, a SiO film is formed on a wafer in a process container according to the same process procedure and process conditions as those of the substrate processing in the above-described embodiments. Then, an adhering substance in the process container is removed according to the same process procedure and process conditions as those of the cleaning process in the above-described embodiments. A $NH_3$ gas is used as the N- and H-containing gas in step a, and a HF gas is used as the F-containing gas in step b.

As a Comparative Example, by using the substrate processing apparatus shown in FIG. 1, a SiO film is formed on a wafer in the process container according to the same process procedure and process conditions as those of the substrate processing in the above-described embodiments. The process procedure and process conditions are the same as those in the Example. Then, a HF gas alone is supplied into the process container to remove an adhering substance in the process container. The process procedure and process conditions when supplying the HF gas are the same as those in step b1 of the Example.

Thereafter, the etching amount of the adhering substance in the process container is measured for each of the Example and the Comparative Example. As a result, the etching amount of the adhering substance in the Comparative Example is 12 Å. On the other hand, the etching amount of the adhering substance in the Example is 1040 Å. In this way, it is confirmed that the etching rate in the cleaning process of the Example increases to be 83 times or more the etching rate in the cleaning process of the Comparative Example.

According to the present disclosure in some embodiments, it is possible to enhance the effect of cleaning the interior of a process container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

removing a substance existing in a process container by performing a cycle a predetermined number of times under a first temperature, the cycle including:

(a) supplying a first gas selected from a group consisting of a nitrogen- and hydrogen-containing gas and a fluorine-containing gas into the process container; and (b) supplying a second gas selected from the group consisting of the nitrogen- and hydrogen-containing gas and the fluorine-containing gas into the process container where the first gas remains, the second gas being different from the first gas, wherein (b) includes:

(b1) supplying the second gas into the process container in a state where exhaust of an interior of the process container is stopped; and (b2) supplying the second gas into the process container in a state where the exhaust of the interior of the process container is performed.

2. A cleaning method, comprising:

removing a substance existing in a process container by performing a cycle a predetermined number of times under a first temperature, the cycle including:

(a) supplying a first gas selected from a group consisting of a nitrogen- and hydrogen-containing gas and a fluorine-containing gas into the process container; and (b) supplying a second gas selected from the group consisting of the nitrogen- and hydrogen-containing gas and the fluorine-containing gas into the process container where the first gas remains, the second gas being different from the first gas, wherein (b) includes:

(b1) supplying the second gas into the process container in a state where exhaust of an interior of the process container is stopped; and (b2) supplying the second gas into the process container in a state where the exhaust of the interior of the process container is performed.

3. The method of claim 2, wherein in (a), the interior of the process container is filled with the first gas, and wherein in (b), the second gas is mixed with the first gas that has filled the interior of the process container.

4. The method of claim 2, wherein in (b), after the supply of the first gas into the process container is stopped, the supply of the second gas into the process container is started.

5. The method of claim 2, wherein in (a), the first gas is supplied into the process container in a state where exhaust of the interior of the process container is performed.

6. The method of claim 2, wherein the cycle further includes (c) exhausting the interior of the process container in a state where the supply of the nitrogen- and hydrogen-containing gas and the fluorine-containing gas into the process container is stopped.

7. The method of claim 2, wherein an internal pressure of the process container in (a) is set as a first pressure, wherein an internal pressure of the process container in (b1) is set as a second pressure higher than the first pressure, and wherein an internal pressure of the process container in (b2) is set as a third pressure equal to or higher than the second pressure.

8. The method of claim 2, wherein the cycle further includes (c) exhausting the interior of the process container in a state where the supply of the nitrogen- and hydrogen-containing gas and the fluorine-containing gas into the process container is stopped, wherein an internal pressure of the process container in (a) is set as a first pressure, wherein an internal pressure of the process container in (b1) is set as a second pressure higher than the first pressure, wherein an internal pressure of the process container in (b2) is set as a third pressure equal to or higher than the second pressure, and wherein an internal pressure of the process container in (c) is set as a fourth pressure lower than the third pressure.

9. The method of claim 2, wherein the cycle further includes (c) exhausting the interior of the process container in a state where the supply of the nitrogen- and hydrogen-containing gas and the fluorine-containing gas into the process container is stopped, wherein the method further comprises (d) heating and exhausting the interior of the process container under a second temperature equal to or higher than the first temperature, wherein an internal pressure of the process container in (a) is set as a first pressure, wherein an internal pressure of the process container in (b1) is set as a second pressure higher than the first pressure, wherein an internal pressure of the process container in (b2) is set as a third pressure equal to or higher than the second pressure, wherein an internal pressure of the process container in (c) is set as a fourth pressure lower than the third pressure, and wherein an internal pressure of the process container in (d) is set as a fifth pressure lower than the third pressure.

10. The method of claim 2, wherein a supply flow rate of the first gas in (a) is larger than a supply flow rate of the second gas in (b).

11. The method of claim 2, wherein a supply time of the second gas in (b) is longer than a supply time of the first gas in (a).

12. The method of claim 2, wherein at least a portion of the substance existing in the process container is removed by performing the cycle the predetermined number of times, and a portion of a by-product produced at that time is removed.

13. The method of claim 2, wherein the first gas is the nitrogen- and hydrogen-containing gas, and the second gas is the fluorine-containing gas.

14. The method of claim 2, wherein the nitrogen- and hydrogen-containing gas includes at least one selected from a group consisting of a $NH_3$ gas, a $N_2H_2$ gas, a $N_2H_4$ gas, and a $N_3H_8$ gas, and wherein the fluorine-containing gas includes at least one selected from a group consisting of a $F_2$ gas, a $ClF_3$ gas, a $ClF$ gas, a $NF_3$ gas, and a HF gas.

15. The method of claim 2, wherein the nitrogen- and hydrogen-containing gas includes a $NH_3$ gas, and the fluorine-containing gas includes a HF gas.

16. The method of claim 2, wherein the substance existing in the process container contains silicon and oxygen.

17. The method of claim 2, wherein the act of removing the substance existing in the process container is performed under a non-plasma atmosphere.

18. The method of claim 2, further comprising (d) heating and exhausting the interior of the process container under a second temperature equal to or higher than the first temperature.

19. The method of claim 18, wherein at least a portion of the substance existing in the process container is removed by performing the cycle the predetermined number of times, and a portion of a by-product produced at that time is removed, and wherein in (d), the by-product remaining in the process container is sublimated.

20. The method of claim 18, wherein the act of removing the substance existing in the process container and (d) are performed one or more times.

21. A processing apparatus configured to perform the method of claim 1.

22. A non-transitory computer-readable recording medium storing a program that causes, by a computer, a processing apparatus to perform a process comprising:

removing a substance existing in a process container by performing a cycle a predetermined number of times under a first temperature, the cycle including:

(a) supplying a first gas selected from a group consisting of a nitrogen- and hydrogen-containing gas and a fluorine-containing gas into the process container; and (b) supplying a second gas selected from the group consisting of the nitrogen- and hydrogen-containing gas and the fluorine-containing gas into the process container where the first gas remains, the second gas being different from the first gas, wherein (b) includes:

(b1) supplying the second gas into the process container in a state where exhaust of an interior of the process container is stopped; and (b2) supplying the second gas into the process container in a state where the exhaust of the interior of the process container is performed.

* * * * *